US009887101B2

(12) United States Patent
Kubota et al.

(10) Patent No.: US 9,887,101 B2
(45) Date of Patent: Feb. 6, 2018

(54) METHOD FOR MANUFACTURING SEMICONDUCTOR DEVICE (71) Applicant: Sumitomo Electric Industries, Ltd., Osaka (JP)

(72) Inventors: Ryosuke Kubota, Osaka (JP); So Tanaka, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 14/912,509

(22) PCT Filed: Jul. 8, 2014

(86) PCT No.: PCT/JP2014/068134
§ 371 (c)(1),
(2) Date: Feb. 17, 2016

(87) PCT Pub. No.: WO2015/025628
PCT Pub. Date: Feb. 26, 2015

(65) Prior Publication Data
US 2016/0204000 A1 Jul. 14, 2016

(30) Foreign Application Priority Data

Aug. 21, 2013 (JP) ................... 2013-171239

(51) Int. Cl.
*H01L 21/425* (2006.01)
*H01L 21/324* (2006.01)
(Continued)

(52) U.S. Cl.
CPC ...... *H01L 21/324* (2013.01); *H01L 21/02529* (2013.01); *H01L 21/046* (2013.01);
(Continued)

(58) Field of Classification Search
CPC .......... H01L 21/6831; H01L 21/02529; H01L 21/046; H01L 21/2253
See application file for complete search history.

(56) References Cited

U.S. PATENT DOCUMENTS

2001/0055189 A1 12/2001 Hagi
2003/0186545 A1* 10/2003 Kamp ............... H01L 21/31116
438/689
(Continued)

FOREIGN PATENT DOCUMENTS

JP 2001-148371 A 5/2001
JP 2001-152335 A 6/2001
(Continued)

OTHER PUBLICATIONS

International Search Report for PCT International Application No. PCT/JP2014/068134, dated Oct. 14, 2014.

*Primary Examiner* — Bradley K Smith
(74) *Attorney, Agent, or Firm* — IPUSA, PLLC (57) ABSTRACT

A method for manufacturing a semiconductor device in accordance with the present invention includes the steps of preparing a semiconductor substrate, placing the semiconductor substrate on an electrostatic chuck, chucking the semiconductor substrate after raising a temperature of the electrostatic chuck to a first temperature, raising a temperature of the electrostatic chuck to a second temperature which is higher than the above-described first temperature in a state where the semiconductor substrate is chucked, and performing a treatment to the semiconductor substrate in a state where a temperature of the electrostatic chuck is maintained at the above-described second temperature.

14 Claims, 6 Drawing Sheets

(51) Int. Cl.
*H01L 21/02* (2006.01)
*H01L 21/225* (2006.01)
*H01L 21/683* (2006.01)
*H01L 21/04* (2006.01)
*H01L 21/265* (2006.01)
*H01L 21/67* (2006.01)

(52) U.S. Cl.
CPC ........ *H01L 21/2253* (2013.01); *H01L 21/265* (2013.01); *H01L 21/26546* (2013.01); *H01L 21/67248* (2013.01); *H01L 21/6831* (2013.01); *H01L 21/6833* (2013.01)

(56) References Cited

U.S. PATENT DOCUMENTS

| | | | |
|---|---|---|---|
| 2008/0076194 A1* | 3/2008 | Blake | H01J 37/3171 438/5 |
| 2010/0093161 A1 | 4/2010 | Kusumoto et al. | |
| 2010/0254063 A1* | 10/2010 | Sheng | H01L 21/6833 361/234 |
| 2011/0068084 A1 | 3/2011 | Tatsuhiko et al. | |
| 2011/0284505 A1* | 11/2011 | Ricci | H01J 37/32715 219/121.54 |

FOREIGN PATENT DOCUMENTS

| | | |
|---|---|---|
| JP | 2002-009140 A | 1/2002 |
| JP | 2010-187023 A | 8/2010 |
| JP | 2011-084770 A | 4/2011 |
| WO | WO-2008/120467 A1 | 10/2008 |

\* cited by examiner

METHOD FOR MANUFACTURING SEMICONDUCTOR DEVICE

TECHNICAL FIELD

The present invention relates to a method for manufacturing a semiconductor device, more particularly to a method for manufacturing a semiconductor device including the step of heat-treating a large diameter (particularly, larger than 100 mm) semiconductor substrate to a high temperature.

BACKGROUND ART

Conventionally, in a device which performs a treatment of doping impurities to a semiconductor substrate of silicon (Si) or the like or a treatment of forming a film on a semiconductor substrate, an electrostatic chuck has been widely used which adsorbs and retains a semiconductor substrate by means of an electrostatic adsorption force. For example, Japanese Patent Laying-Open No. 2001-152335 (PTD 1) discloses such an electrostatic chuck which is configured to be integral with a heater for adjusting a temperature of a semiconductor substrate.

According to PTD 1, the substrate is placed at a predetermined position on an electrostatic chuck plate in a state where an electric current is applied to the heater to heat the electrostatic chuck to a predetermined temperature. Then, an electrostatic chuck power supply is activated, and an applied voltage with respect to an adsorption electrode is cumulatively increased until a temperature of the substrate reaches a predetermined reference temperature.

CITATION LIST

Patent Document

PTD 1: Japanese Patent Laying-Open No. 2001-152335

SUMMARY OF INVENTION

Technical Problem

In recent years, as a semiconductor substrate for the use in manufacturing a semiconductor device, the use of a wide band gap semiconductor substrate having a band gap which is than that of silicon has begun. This wide band gap semiconductor representatively includes silicon carbide (SiC) crystal, gallium nitride (GaN), diamond, and the like. Further, in order to efficiently manufacture a semiconductor device using such a wide band gap semiconductor substrate, a diameter of a semiconductor substrate has been increased.

However, when a large-diameter semiconductor substrate is employed, the amount of warpage which occurs in the semiconductor substrate increases remarkably in the step of heat-treating the semiconductor substrate to a high temperature. Moreover, since the flatness of the silicon carbide substrate is impaired due to this warpage, it would be difficult to allow the semiconductor substrate to be adsorbed to an electrostatic chuck of an ion implantation device in a treatment of performing ion implantation under a high temperature, such as doping. Therefore, temperature variation may occur in a semiconductor substrate plane.

Further, when ion implantation is performed with respect to a semiconductor substrate having poor flatness, variation may occur in the shape of an impurity region formed in the semiconductor substrate. Such variation may become a factor of increasing variation in element characteristics in the semiconductor substrate plane, so that a yield of the semiconductor device may be deteriorated.

The present invention was made to solve such a problem, and an object of the present invention is to provide a method for manufacturing a semiconductor device capable of reducing production variation in the semiconductor substrate plane in the step of heat-treating a large-diameter semiconductor substrate to a high temperature.

Solution to Problem

A method for manufacturing a semiconductor device in accordance with the present invention includes the steps of preparing a semiconductor substrate, placing the semiconductor substrate on an electrostatic chuck, chucking the semiconductor substrate after raising a temperature of the electrostatic chuck to a first temperature, raising a temperature of the electrostatic chuck to a second temperature which is higher than the first temperature in a state where the semiconductor substrate is chucked, and performing a treatment to the semiconductor substrate in a state where a temperature of the electrostatic chuck is maintained at the second temperature.

Advantageous Effects of Invention

According to the present invention, production variation in the semiconductor substrate plane in the step of heat-treating a large-diameter semiconductor substrate to a high temperature can be reduced.

DESCRIPTION OF EMBODIMENTS

Description of Embodiments of the Present Invention

Firstly, contents of embodiments of the present invention will be listed and illustrated.

(1) A method for manufacturing a semiconductor device in accordance with the present invention includes the steps of preparing a semiconductor substrate, placing the semiconductor substrate on an electrostatic chuck, chucking the semiconductor substrate after raising a temperature of the electrostatic chuck to a first temperature, raising a temperature of the electrostatic chuck to a second temperature which is higher than the first temperature in a state where the semiconductor substrate is chucked, and performing a treatment to the semiconductor substrate in a state where a temperature of the electrostatic chuck is maintained at the second temperature.

According to this configuration, in a state where the temperature of the electrostatic chuck is raised to a temperature (first temperature) which is lower than a treatment temperature (second temperature) of the semiconductor substrate, warpage of the semiconductor substrate on the electrostatic chuck is suppressed. Therefore, the semiconductor substrate can be securely adsorbed to the electrostatic chuck. Thus, by raising the temperature of the electrostatic chuck to the second temperature in this state, the temperature of the semiconductor substrate can be uniformly raised to the second temperature. Moreover, since the flatness of the semiconductor substrate is maintained, process variation in the semiconductor substrate plane can be reduced. Consequently, a yield of the semiconductor device can be improved.

(2) In the method for manufacturing a semiconductor device described above, in the step of raising a temperature to the second temperature, raising a temperature of the electrostatic chuck is started after a temperature of the semiconductor substrate is raised to the first temperature.

In this case, a temperature of the electrostatic chuck is raised to the second temperature after waiting until a temperature of the semiconductor substrate is uniformly raised to the first temperature. Therefore, a temperature of the semiconductor substrate can be uniformly raised to the second temperature.

(3) In the method for manufacturing a semiconductor device, the electrostatic chuck includes an electrode configured to generate an electrostatic adsorption force with respect to the semiconductor substrate in accordance with an applied voltage. In the step of chucking the semiconductor substrate, a first voltage is applied to the electrode. In the step of raising a temperature to the second temperature, the applied voltage to the electrode is increased to a second voltage which is higher than the first voltage.

Although a stress acts on an adhesion surface between the semiconductor substrate and the electrostatic chuck so as to suppress thermal expansion of the semiconductor substrate, this stress is relaxed by increasing the electrostatic adsorption force in accordance with a rise in the substrate temperature. Accordingly, a stage of the electrostatic chuck can be prevented from being damaged.

It should be noted that the first voltage may be applied to the electrode in the step of chucking the semiconductor substrate, and the applied voltage to the electrode may be lowered to a voltage which is lower than the first voltage in the step of raising the temperature to the second temperature. By lowering the electrostatic adsorption force at the time of occurrence of warpage in the semiconductor substrate on the electrostatic chuck, a crack in the semiconductor substrate can be prevented.

Alternatively, the applied voltage to the electrode may be equal in the step of chucking the semiconductor substrate and in the step of raising the temperature to the second temperature. In this case, since a control mechanism for controlling the applied voltage to the electrostatic chuck is simplified, the production cost can be reduced. It should be noted that, in any of the above-described cases, the second voltage is set to be the voltage which can suppress occurrence of a crack in the semiconductor substrate.

(4) The method for manufacturing a semiconductor device described above further includes the step of, after the step of performing a treatment to the semiconductor substrate, releasing chucking of the semiconductor substrate after lowering a temperature of the electrostatic chuck to the first temperature.

In such a manner, since chucking of the semiconductor substrate is released after the temperature of the electrostatic chuck is raised to the first temperature, warpage of the semiconductor substrate after releasing of chucking is suppressed, so that conveyance of the semiconductor substrate can be readily performed. Moreover, since next semiconductor substrate can be placed on the electrostatic chuck continuously after conveyance of the semiconductor substrate, a throughput of the manufacturing step can be improved.

(5) The method for manufacturing a semiconductor device described above further includes the step of, after the step of performing a treatment to a semiconductor substrate, releasing chucking of the semiconductor substrate after lowering a temperature of the electrostatic chuck to a third temperature which is lower than or equal to the second temperature and higher than or equal to the first temperature.

In this case, when an electrostatic adsorption force of the electrostatic chuck is reduced in a state where the semiconductor substrate reaches the third temperature, warpage occurs in the semiconductor substrate. Accordingly, since a distance between the electrostatic chuck and the semiconductor substrate becomes greater, the semiconductor substrate is readily peeled off from the electrostatic chuck.

(6) In the method for manufacturing a semiconductor device described above, the first temperature is set to be within a range of a substrate temperature in which an amount of warpage of the semiconductor device is smaller than or equal to an acceptable value at which the electrostatic chuck can chuck the semiconductor substrate.

In such a manner, since warpage of the semiconductor substrate on the electrostatic chuck is suppressed in a state where the temperature of the electrostatic chuck is raised to the first temperature, the semiconductor substrate can be securely adsorbed to the electrostatic chuck.

(7) In the method for manufacturing a semiconductor device described above, the first temperature is set to be within a temperature range in which a rate of change in an electrostatic capacity of the electrostatic chuck before and after the step of chucking the semiconductor substrate becomes less than or equal to a threshold value.

The electrostatic capacity of the electrostatic chuck is changed in accordance with presence and absence of the electrostatic adsorption force of the electrostatic chuck. Therefore, the threshold value is provided in the rate of change in the electrostatic capacity before and after the step of chucking the semiconductor substrate, and the range of the substrate temperature in which this rate of change becomes less than or equal to the threshold value is set as the range of the substrate temperature in which the electrostatic chuck can chuck the semiconductor substrate. Accordingly, since warpage of the semiconductor substrate on the electrostatic chuck is suppressed in the state where the electrostatic chuck is raised to the first temperature, the semiconductor substrate can be securely adsorbed to the electrostatic chuck.

(8) In the method for manufacturing a semiconductor device described above, the first temperature is set to be within a temperature range in which an amount of change in a temperature of the semiconductor substrate before and after the step of chucking the semiconductor substrate becomes greater than or equal to a threshold value.

The temperature of the semiconductor substrate on the electrostatic chuck is changed in accordance with presence and absence of the electrostatic adsorption force of the electrostatic chuck. Therefore, the threshold value is provided in the amount of change in the substrate temperature before and after the step of chucking the semiconductor substrate, and the range of the substrate temperature in which this amount of change becomes greater than or equal to the threshold value is set to be the range of the substrate temperature in which the electrostatic chuck can chuck the semiconductor substrate. Accordingly, since warpage of the semiconductor substrate on the electrostatic chuck is suppressed in a state where the electrostatic chuck is raised to the first temperature, the semiconductor substrate can be securely adsorbed to the electrostatic chuck.

(9) In the method for manufacturing a semiconductor device described above, the step of performing a treatment to a semiconductor substrate includes the step of implanting impurity ion to the semiconductor substrate. The second temperature is set to be within a temperature range of higher than or equal to 100° C. and lower than or equal to 800° C. The first temperature is set to be within a temperature range of higher than or equal to a room temperature and lower than or equal to 700° C.

The second temperature is set to be within the temperature range of higher than or equal to 100° C. and lower than or equal to 800° C., preferably the temperature range of higher than or equal to 200° C. and lower than or equal to 600° C. In such a manner, since variation in the semiconductor substrate plane (temperature variation and process variation) in the step of implanting impurity ion to the semiconductor substrate can be reduced, a yield of the semiconductor device can be improved.

(10) In the method for manufacturing a semiconductor device described above, the semiconductor substrate is a compound semiconductor substrate having an outer diameter which is larger than 100 mm.

According to this, even with use of a large diameter compound semiconductor substrate, variation in the semiconductor substrate plane in the step of heat-treating the semiconductor substrate to a high temperature can be reduced. Therefore, a semiconductor device can be manufactured efficiently with a good yield.

(11) In the method for manufacturing a semiconductor device described above, the semiconductor substrate is a silicon carbide semiconductor substrate having an outer diameter which is larger than 100 mm.

In this case, the silicon carbide semiconductor device can be manufactured efficiently with a high yield.

DETAILS OF EMBODIMENTS OF THE PRESENT INVENTION

In the following, embodiments of the present invention will be described with reference to the drawings. It should be noted that the same or corresponding parts have the same reference numerals allotted in the drawings, and description thereof will not be repeated.

Figure 1:
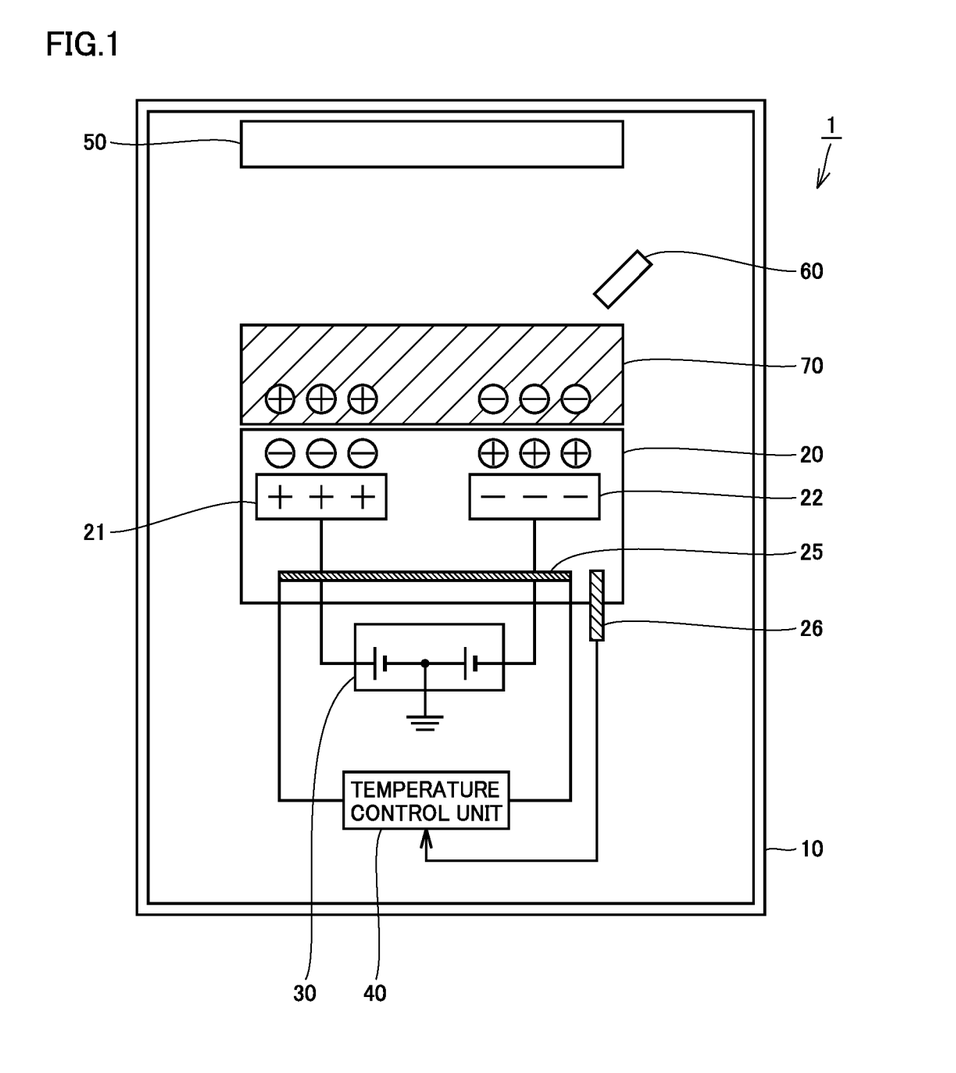
FIG. 1 is a schematic configuration diagram showing an ion implantation device which is a manufacturing device for performing the method for manufacturing a semiconductor device in accordance with an embodiment of the present invention.
Figure 2:
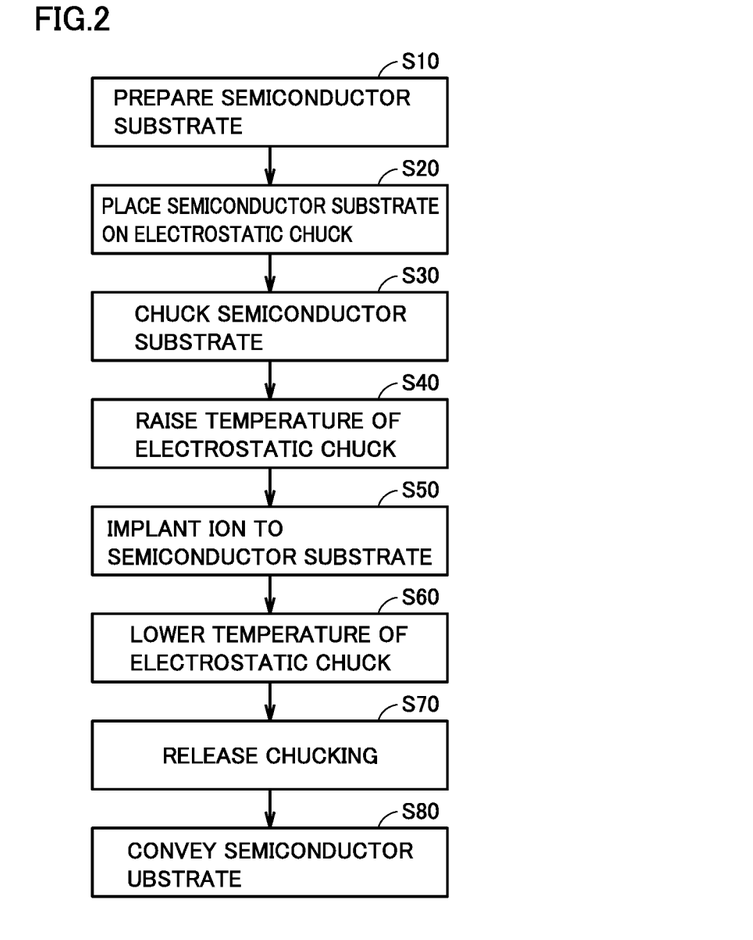
FIG. 2 is a flowchart for illustrating the method for manufacturing a semiconductor device in accordance with the embodiment of the present invention.

Referring to FIGS. 1 and 2, a method for manufacturing a semiconductor device in accordance with the embodiment of the present invention will be described. The method for manufacturing a semiconductor device in accordance with the embodiment of the present invention includes the step of heat-treating a semiconductor substrate to a high temperature. In the present embodiment, as a representative example of the step of heat-treating, the step of implanting impurity ion to the semiconductor substrate under a high temperature will be described. It should be noted that the step of heat-treating a semiconductor substrate includes the step of forming a film on the semiconductor substrate through a vacuum evaporation method, a sputtering method, a CVD (Chemical Vapor Deposition) method, and the like. Moreover, a manufacturing device for performing the method for manufacturing a semiconductor device in accordance with the embodiment of the present invention includes, in addition to an ion implantation device which will be described later, a CVD apparatus for forming an oxide film (for example, a PSG oxide film, an $SiO_2$ oxide film, and the like), a dry etcher, or the like.

<Entire Configuration of Manufacturing Device of Semiconductor Device>

FIG. 1 is a schematic configuration diagram showing an ion implantation device which is a manufacturing device for performing the method for manufacturing a semiconductor device in accordance with the embodiment of the present invention.

Referring to FIG. 1, ion implantation device 1 includes a vacuum chamber 10, an electrostatic chuck 20, a direct current power supply 30, a temperature control unit 40, a source 50, and a temperature sensor 60. Vacuum chamber 10 is a processing chamber for retaining therein a subject such as a semiconductor substrate and implanting impurity ion onto a surface of the subject.

In vacuum chamber 10, source 50 and electrostatic chuck 20 are installed so as to face each other. Source 50 is an ionization source for generating impurity ion and irradiates the generated impurity ion toward the subject on electrostatic chuck 20.

Electrostatic chuck 20 has a stage formed into a disk-like shape with use of dielectrics, and semiconductor substrate 70 is placed on this stage. Electrostatic chuck 20 adsorbs semiconductor substrate 70 to retain semiconductor substrate 70 in vacuum chamber 10.

Specifically, electrostatic chuck 20 includes a pair of electrostatic adsorption electrodes 21, 22. The pair of electrostatic adsorption electrodes 21, 22 are connected to direct current power supply 30 arranged outside of electrostatic chuck 20. Direct current power supply 30 applies a positive voltage to one (electrostatic adsorption electrode 21) of the pair of electrostatic adsorption electrodes 21, 22, and applies a negative voltage to the other (electrostatic adsorption electrode 22).

It should be noted that, although illustration is omitted, electrostatic chuck 20 may be configured to include a unipolar electrostatic adsorption electrode. By applying a positive voltage or a negative voltage to the unipolar electrostatic adsorption electrode, a Coulomb force acts between an electric charge inside of electrostatic chuck 20 and an electric charge pulled to a positive or negative charge in semiconductor substrate 70. Accordingly, an electrostatic adsorption force is generated between electrostatic chuck 20 and semiconductor substrate 70.

By applying positive and negative voltages respectively to electrostatic adsorption electrodes 21, 22, as shown in FIG. 1, positive and negative electric charges are generated on respective surfaces of electrostatic chuck 20 and semiconductor substrate 70. The electrostatic adsorption force acts between electrostatic chuck 20 and semiconductor substrate 70, so that semiconductor substrate 70 is adsorbed and retained (chucked) to electrostatic chuck 20.

It should be noted that a voltage control circuit (not shown) for changing the voltages to be applied to the pair of electrostatic adsorption electrodes 21, 22 is provided in direct current power supply 30. As the applied voltages to electrostatic adsorption electrodes 21, 22 become greater, the electrostatic adsorption force acting between electrostatic chuck 20 and semiconductor substrate 70 becomes greater. In other words, as the voltage control circuit changes the applied voltages to the pair of electrostatic adsorption electrodes 21, 22, a magnitude of the electrostatic adsorption force is changed.

Moreover, when the voltage control circuit inverses the polarities of the applied voltages to the pair of electrostatic adsorption electrodes 21, 22, electric charges of polarities reversed with respect to the electric charges described above are generated on respective surfaces of electrostatic chuck 20 and semiconductor substrate 70. Accordingly, the positive and negative electric charges are cancelled out, so that electric charges accumulated on electrostatic chuck 20 and semiconductor substrate 70 are reduced. As a result, the adsorption force of electrostatic chuck 20 is reduced, so that chucking is released.

Electrostatic chuck 20 further includes a heater 25, serving as a heating member for heating semiconductor substrate 70, and a temperature sensor 26. Heater 25 is provided in electrostatic chuck 20. Any heating mechanism can be used as heater 25. For example, an electrothermal heater may be used. Temperature sensor 26 is provided in electrostatic chuck 20 and measures a temperature of electrostatic chuck 20 (hereinafter, also referred to as "chuck temperature"). As temperature sensor 26, a thermocouple can be used. Temperature control unit 40 detects a measured value of temperature sensor 26 and controls the temperature of electrostatic chuck 20. Specifically, when heater 26 is an electrothermal heater, temperature control unit 40 controls electric power supplied to heater 25 so that the measured value of temperature sensor 26 matches a target temperature. When the electrostatic chuck 20 is heated by heater 25, and a temperature thereof is raised, the semiconductor substrate 70 receives a supply of heat from electrostatic chuck 20, and a temperature thereof is raised. By performing a temperature control for electrostatic chuck 20 in such a manner, the temperature of semiconductor substrate 70 (hereinafter, also referred to as "substrate temperature") is controlled to a target temperature. Temperature sensor 60 is provided in vacuum chamber 10 and measures a substrate temperature. For example, as temperature sensor 60, a radiation thermometer can be used. It should be noted that, when the radiation thermometer is used, temperature sensor 60 may be provided outside of vacuum chamber 10.

<Method for Manufacturing Semiconductor Device>

FIG. 2 is a flowchart illustrating the method for manufacturing a semiconductor device in accordance with the embodiment of the present invention. The process of implanting impurity ion to semiconductor substrate 70 with use of ion implantation device 1 shown in FIG. 1 will be described.

Referring to FIG. 2, in the method for manufacturing a semiconductor device, the step of preparing semiconductor substrate 70 (S10) is firstly performed. As semiconductor substrate 70, a compound semiconductor substrate having an outer diameter which is larger than 100 mm can be used. The compound semiconductor substrate includes, other than the wide band gap semiconductor substrate, a gallium arsenide (GaAs) substrate and the like. In the following description, as semiconductor substrate 70, a silicon carbide semiconductor substrate having an outer diameter which is larger than 100 mm is used.

Here, the shape of semiconductor substrate 70 used in the method for manufacturing a semiconductor device in accordance with the embodiment of the present invention will be described in detail. The shape of the semiconductor substrate is represented by a ratio d/2R [μm/mm] of a thickness d [μm] and an outer diameter 2R [mm] of a semiconductor substrate. Semiconductor substrate 70 preferably has outer diameter 2R which is larger than 100 mm and d/2R within the range of greater than or equal to 1 and less than or equal to 5. More preferably, d/2R is greater than or equal to 1.75 and less than or equal to 5.0.

Next, the step of placing semiconductor substrate 70 (S20) is performed. In this step, semiconductor substrate 70 is conveyed into vacuum chamber 10 of ion implantation device 1, and, semiconductor substrate 70 is placed on the stage of electrostatic chuck 20, as shown in FIG. 1.

Next, the step of chucking semiconductor substrate 70 (S30) is performed. In this step, positive and negative voltages are respectively applied to the pair of electrostatic adsorption electrodes 21, 22 in electrostatic chuck 20 to generate the electrostatic adsorption force on electrostatic chuck 20. Accordingly, semiconductor substrate 70 is adsorbed and retained on electrostatic chuck 20.

Next, the step of raising a temperature of electrostatic chuck 20 (S40) is performed. In this step, temperature control unit 40 controls an electric current applied to heater 25 while measuring a temperature of electrostatic chuck 20 by means of temperature sensor 26, so that electrostatic chuck 20 is heated to a predetermined target temperature. This target temperature is set to be a temperature of an ion implantation treatment. The temperature of the ion implantation treatment is higher than or equal to 100° C. and lower than or equal to 800° C., preferably higher than or equal to 200° C. and lower than or equal to 600° C. It should be noted that the target temperature in the case where the silicon carbide semiconductor substrate is used is preferably higher than or equal to 200° C. and lower than or equal to 600° C., which is for example about 440° C. Semiconductor substrate 70 adsorbed and retained on electrostatic chuck 20 is heated by heat transmission from electrostatic chuck 20, so that the temperature is raised to the target temperature (for example, 440° C.).

Next, the step of implanting ion to semiconductor substrate 70 (S50) is performed. In this step, impurity ion is implanted to semiconductor substrate 70 which is raised in its temperature to the target temperature by the step of raising the temperature of electrostatic chuck 20 (S40). Specifically, a region having a conductivity type of p-type is formed in an epitaxial layer of the silicon carbide semiconductor substrate by implanting p-type impurities such as aluminum (Al), boron (B) or the like. Moreover, a region having a conductivity type of n-type is formed by introducing n-type impurities such as P (phosphorus) into the epitaxial layer.

Next, the step of lowering a temperature of electrostatic chuck 20 (S60) is performed. In this step, temperature control unit 40 lowers a temperature of electrostatic chuck 20 by reducing the amount of an electric current applied to heater 25 or by stopping an electric current applied to heater 25. Following the lowering of the temperature of electrostatic chuck 20, the substrate temperature of semiconductor substrate 70 is also lowered.

Next, the step of releasing chucking of semiconductor substrate 70 (S70) is performed. In this step, the polarities of the voltages applied to the pair of electrostatic adsorption electrodes 21, 22 in electrostatic chuck 20 are inversed to reduce the absorption force of electrostatic chuck 20.

Finally, the step of conveying semiconductor substrate 70 (S80) is performed. In this step, semiconductor substrate 70 is conveyed to outside of vacuum chamber 10 of ion implantation device 1. Accordingly, a series of ion implantation steps is completed.

Figure 3:
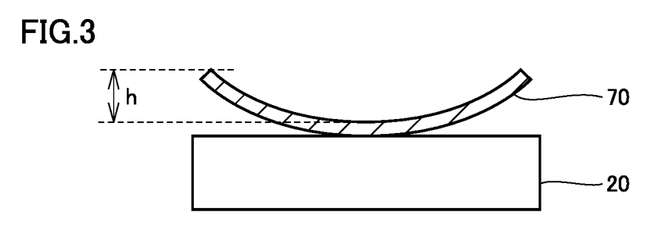
FIG. 3 is a schematic view for illustrating definition of an amount of warpage in the semiconductor substrate.

Here, thermal expansion and warpage occur in semiconductor substrate 70 placed on electrostatic chuck 20 due to heating by electrostatic chuck 20 (heater 25). In the following description, the warpage condition (hereinafter, referred to as "amount of warpage") of semiconductor substrate 70 is defined as a height difference h between a highest position and a lowest position of a main surface of semiconductor substrate 70 with respect to the stage of electrostatic chuck 20 when, as shown in FIG. 3, semiconductor substrate 70 is placed on electrostatic chuck 20. It should be noted that warpage of semiconductor substrate 70 includes the case where the main surface of semiconductor substrate 70 protrudes toward the side of the stage (the case of FIG. 3) and the case where the main surface of semiconductor substrate 70 protrudes toward the side opposite to the stage. The amount of warpage h represents a magnitude of warpage in these two cases.

The amount of warpage h of semiconductor substrate 70 generally becomes greater as the substrate temperature is raised. However, a relationship between the substrate temperature and the amount of warpage h may differ due to a material and a crystal structure of the semiconductor substrate. Moreover, even when semiconductor substrates are of the same kind, a semiconductor substrate having a larger outer diameter have a greater amount of warpage h at the same substrate temperature. It should be noted that semiconductor substrate 70 may have a crystal plane of an Si plane or a C plane. Moreover, the warpage of semiconductor substrate 70 at the room temperature may be in the case where the main surface of semiconductor substrate 70 protrudes toward the side of the stage or the case where the main surface of semiconductor substrate 70 protrudes toward the side opposite to the stage.

Figure 4:
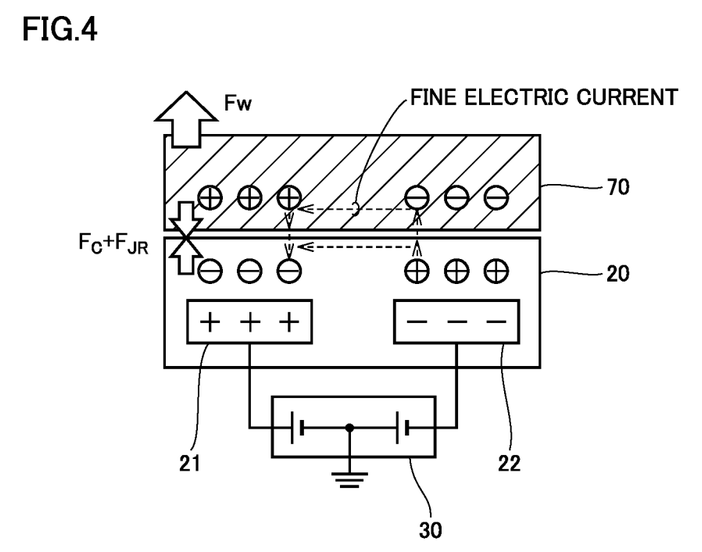
FIG. 4 schematically shows a force acting on the semiconductor substrate on the electrostatic chuck.

FIG. 4 schematically shows a force acting on semiconductor substrate 70 on electrostatic chuck 20. Referring to FIG. 4, positive and negative voltages are respectively applied to the pair of electrostatic adsorption electrodes 21, 22, so that positive and negative electric charges are generated on respective surfaces of electrostatic chuck 20 and semiconductor substrate 70. These electric charges generate the electrostatic adsorption force between electrostatic chuck 20 and semiconductor substrate 70. Specifically, the electrostatic adsorption force has a magnitude corresponding to a sum of a Coulomb force $F_C$ acting between an electric charge inside of electrostatically polarized electrostatic chuck 20 and an electric charge pulled to a positive or negative electric charge in semiconductor substrate 70 and a Johnson Rarbeck force $F_{JR}$ generated by a fine electric current flowing via a fine gap between semiconductor substrate 70 and electrostatic chuck 20. It should be noted that magnitudes of Coulomb force $F_C$ and Johnson Rarbeck force $F_{JR}$ are inverse proportion to a distance between semiconductor substrate 70 and electrostatic chuck 20. Therefore, as the distance between semiconductor substrate 70 and electrostatic chuck 20 becomes greater, the electrostatic adsorption force becomes smaller.

Moreover, when the substrate temperature is raised by heat transmission from electrostatic chuck 20, a force FW for warping acts on semiconductor substrate 70. This force FW becomes greater as the substrate temperature becomes higher, and provides semiconductor substrate 70 with a bowl-shaped warpage (FIG. 3) where a central portion of semiconductor substrate 70 is depressed.

Therefore, in the state where the substrate temperature is high, the warpage of semiconductor substrate 70 causes the distance between semiconductor substrate 70 and electrostatic chuck 20 to be greater, so that almost no electrostatic adsorption force ($=F_C+F_{JR}$) acts, and it becomes difficult to allow semiconductor substrate 70 to be adsorbed on electrostatic chuck 20. Thus, in order to allow semiconductor substrate 70 to be adsorbed on electrostatic chuck 20, it would be necessary to generate the electrostatic adsorption force between electrostatic chuck 20 and semiconductor substrate 70 in the state of the substrate temperature where the warpage does not occur in semiconductor substrate 70.

Therefore, in the method for manufacturing a semiconductor device in accordance with the present embodiment, after raising the temperature of electrostatic chuck 20 to a predetermined standby temperature, the electrostatic adsorption force is generated between electrostatic chuck 20 and the semiconductor substrate. Then, in a state where semiconductor substrate 70 is adsorbed and retained on electrostatic chuck 20, the temperature of electrostatic chuck 20 is further raised to a target temperature of the ion implanting step.

In other words, in the present embodiment, the temperature of electrostatic chuck 20 is raised to the target temperature by at least two steps of temperature-raising operation. At this time, semiconductor substrate 70 is adsorbed on electrostatic chuck 20 after performing the first step of the temperature-raising operation, and the second step of the temperature-raising operation is performed in the state where semiconductor substrate 70 is adsorbed on electrostatic chuck 20.

<Setting Standby Temperature>

Here, the term "standby temperature" is a temperature which is lower than the target temperature (for example, 440° C.) of the ion implanting step and is set to be within a range of the substrate temperature in which ion implantation the electrostatic adsorption force can be generated between electrostatic chuck 20 and semiconductor substrate 70. Specifically, the standby temperature is set to be within a range of the substrate temperature in which amount of warpage h of the semiconductor substrate (FIG. 3) is smaller than or equal to the acceptable value at which electrostatic chuck 20 can chuck semiconductor substrate 70. This acceptable value corresponds a limit value of amount of warpage h of semiconductor substrate at which further warpage of semiconductor substrate 70 causes the electrostatic adsorption force not to be generated between electrostatic chuck 20 and semiconductor substrate 70.

Illustrating the acceptable value of this amount of warpage h, in the semiconductor substrate having outer diameter 2R=150 mm and thickness d=500 μm, when the substrate temperature is equal to the room temperature, electostatic chuck 20 can chuck the semiconductor substrate with the amount of warpage h=35 μm, but the semiconductor substrate cannot be chucked with the amount of warpage h=40 μm. On the other hand, in the case where the substrate temperature is 440° C., the semiconductor substrate can be chucked with the amount of warpage h=480 μm, but the semiconductor substrate cannot be chucked with the amount of warpage h=500 μm.

As another example, in a semiconductor substrate having outer diameter 2R=150 mm and thickness d=350 μm, when the substrate temperature is 300° C., electrostatic chuck 20 can chuck the semiconductor substrate with the amount of warpage h=480 μm, but the semiconductor substrate cannot be chucked with the amount of warpage h=500 μm. On the other hand, when the substrate temperature is 150° C., the semiconductor substrate can be chucked with the amount of warpage h=80 μm, but the semiconductor substrate cannot be chucked when the amount of warpage h=100 μm.

The range of the substrate temperature in which the electrostatic adsorption force can be generated between electrostatic chuck 20 and semiconductor substrate 70 can be set in accordance with an evaluation result of a relationship between a flatness of semiconductor substrate 70 and the electrostatic adsorption force of electrostatic chuck 20. The relationship between the flatness of semiconductor substrate 70 and the electrostatic adsorption force of electrostatic chuck 20 can be evaluated by the method described below.

Figure 5:
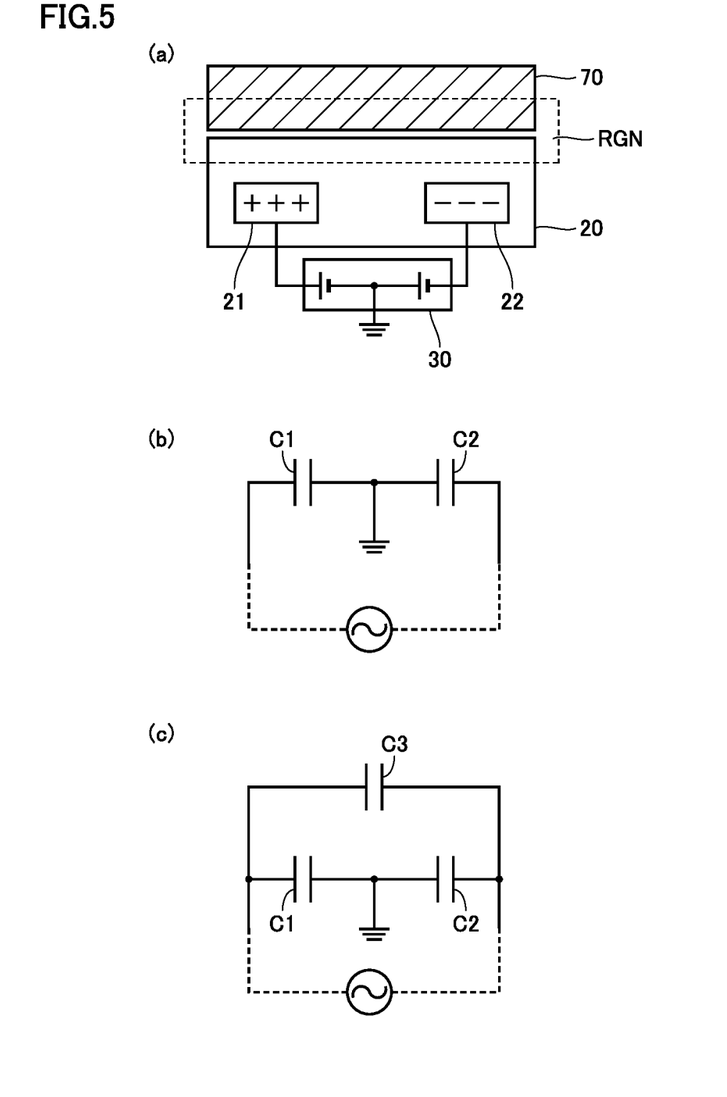
FIG. 5 illustrates a method for evaluating an electrostatic adsorption force of the electrostatic chuck.

FIG. 5 represents a method for evaluating an electrostatic adsorption force of electrostatic chuck 20. A region RGN in FIG. 5(a) shows a stage of electrostatic chuck 20. The stage of electrostatic chuck 20 is represented by an equivalent circuit including two electrostatic capacities C1, C2 which are connected in series and having a grounded middle point in a state where semiconductor substrate 70 is not placed (refer to FIG. 5(b)).

Then, when semiconductor substrate 70 is placed on electrostatic chuck 20, as shown in FIG. 5(c), an electrostatic capacity C3 of semiconductor substrate 70 is connected in parallel to the series circuit of electrostatic capacities C1, C2 on the equivalent circuit. Therefore, before and after semiconductor substrate 70 is placed, an electrostatic capacity of entire electrostatic chuck 20 is changed. Further, electrostatic capacity C3 of semiconductor substrate 70 is changed by the adsorptivity of semiconductor substrate 70, and becomes greater as the adsorptivity of semiconductor substrate 70 becomes higher. Thus, the electrostatic capacity of entire electrostatic chuck 20 is changed in accordance with presence and absence of semiconductor substrate 70 on electrostatic chuck 20 and in accordance with presence and absence of the electrostatic adsorption force of electrostatic chuck 20.

Therefore, in the present embodiment, a rate of change of the electrostatic capacity of entire electrostatic chuck 20 is calculated, and the electrostatic adsorption force of electrostatic chuck 20 is evaluated based on the rate of change of the calculated electrostatic capacity. Specifically, the electrostatic capacity of entire electrostatic chuck 20 at the time when the alternating voltage is applied to electrostatic chuck 20 is measured. This measurement of the electrostatic capacity is performed in each of the state where semiconductor substrate 70 is not placed on electrostatic chuck 20, in the state where semiconductor substrate 70 is placed on electrostatic chuck 20 but the voltage is not applied to electrostatic adsorption electrodes 21, 22, and in the state where semiconductor substrate 70 is placed on electrostatic chuck 20 and a voltage is applied to electrostatic adsorption electrodes 21, 22. Then, after obtaining measured values of three electrostatic capacities corresponding respectively to the three states described above, the obtained measured values are used to calculate the rate of change in the electrostatic capacity from the measured value in the state where semiconductor substrate 70 is not placed.

More in detail, when it is provided that the electrostatic capacity of entire electrostatic chuck 20 in the state where semiconductor substrate 70 is not placed is $C_0$, the rage of change $\Delta C$ of entire electrostatic capacity C of entire electrostatic chuck 20 is defined by the following expression (1).

$$\Delta C = |C_0 - C|/C_0 \quad (1)$$

Further, when it is provided that the electrostatic capacity of entire electrostatic chuck 20 in the state where semiconductor substrate 70 is placed but the voltage is not applied to electrostatic adsorption electrodes 21, 22 is $C_{OFF}$, the rate of change $\Delta C_{OFF}$ of the electrostatic capacity by placement of semiconductor substrate 70 is expressed by the following expression (2). Moreover, when it is provided that the electrostatic capacity of entire electrostatic chuck 20 in the state where semiconductor substrate 70 is placed and the voltage is applied to electrostatic adsorption electrodes 21, 22 is $C_{ON}$, the rate of change $\Delta C_{ON}$ of the electrostatic capacity by application of the voltage to electrostatic chuck 20 is expressed by the following expression (3).

$$\Delta C_{OFF} = |C_0 - C_{OFF}|/C_0 \quad (2)$$

$$\Delta C_{ON} = |C_0 - C_{ON}|/C_0 \quad (3)$$

As one example of rate of change $\Delta C$ of the electrostatic capacity, in the case of a silicon carbide semiconductor substrate having an outer diameter larger than 100 mm, $\Delta C_{OFF}$ becomes 80%. Moreover, when warpage does not occur in the silicon carbide semiconductor substrate (ideally, the amount of warpage h is almost zero), $\Delta C_{ON}$ almost does not change from $\Delta C_{OFF}$, and becomes 80%. In other words, when semiconductor substrate 70 is normally adsorbed on electrostatic chuck 20, electrostatic capacities C become substantiall the equal values before and after application of the voltage to electrostatic chuck 20 ($C_{ON} \approx C_{OFF}$).

On the other hand, when the warpage occurs in the silicon carbide semiconductor substrate (amount of warpage h≠0), $\Delta C_{ON}$ becomes 50%. In other words, when semiconductor substrate 70 is not normally adsorbed on electrostatic chuck 20, the electrostatic capacity C changes before and after application of the voltage to electrostatic chuck 20 ($C_{ON} \neq C_{OFF}$).

Here, when the rate of change in electrostatic capacity C of entire electrostatic chuck 20 before and after application of the voltage to electrostatic chuck 20 is $\Delta C_{OFF \to ON}$, the rate of change $C_{OFF \to ON}$ in the electrostatic capacity represented by the following expression (4). As described above, the rate of change $\Delta C_{OFF \to ON}$ in the electrostatic capacity becomes an index for evaluating the adsorptivity of electrostatic chuck 20.

$$\Delta C_{OFF \to ON} = |C_{OFF} - C_{ON}|/C_{OFF} \quad (4)$$

In the present embodiment, a threshold value is provided in the rate of change $\Delta C_{OFF \to ON}$ in the electrostatic capacity, and the range of the substrate temperature in which $\Delta C_{OFF \to ON}$ becomes less than or equal to the threshold value is set to be the range of the substrate temperature in which the electrostatic adsorption force can be generated between electrostatic chuck 20 and semiconductor substrate 70. Then, the standby temperature is set within the set range of the substrate temperature. As one example, in the case of a silicon carbide semiconductor substrate having an outer diameter larger than 100 mm, the threshold value is set to be 10%.

The standby temperature is higher than or equal to the room temperature and lower than or equal to 700° C., preferably higher than or equal to 100° C. and lower than or equal to 500° C. It should be noted that the target temperature in the case where the silicon carbide semiconductor substrate is used is preferably higher than or equal to 100° C. and lower than or equal to 500° C., which is for example about 340° C.

With such a configuration, since the wapage of the semiconductor substrate is suppressed in the state where the temperature of electrostatic chuck 20 is raised to the standby temperature, semiconductor substrate 70 can be securely adsorbed on electrostatic chuck 20. Consequently, the temperature of semiconductor substrate 70 can be uniformly raised to the target temperature. Moreover, the shape of the impurity region formed in semiconductor substrate 70 by the ion implantation can be unified. Consequently, a yield of the semiconductor device can be improved.

Further, by setting the standby temperature to an upper limit value of a range of the substrate temperature in which the electrostatic adsorption force can be generated between electrostatic chuck 20 and semiconductor substrate 70, a time required to raise the temperature of semiconductor substrate 70 from the standby temperature to the target temperature can be shortened. Accordingly, a throughput of the ion implanting process is improved.

It should be noted that, in the present embodiment, the example of the configuration in which the standby temperature is set based on the rate of change $\Delta C_{OFF \to ON}$ in the electrostatic capacity of entire electrostatic chuck 20 before and after application of the voltage to electrostatic chuck 20 is described. However, it may be configured to set the standby temperature based on the amount of change in the substrate temperature before and after application of the voltage to electrostatic chuck 20.

For example, in the case of a silicon carbide semiconductor substrate having an outer diameter larger than 100 mm, as long as semiconductor substrate 70 is normally adsorbed on electrostatic chuck 20, the measured value of the substrate temperature by temperature sensor 60 is changed by greater than or equal to 100° C. before and after application of the voltage to electrostatic chuck 20. On the other hand, in the case where semiconductor substrate 70 is not normally adsorbed on electrostatic chuck 20, the measured value of the substrate temperature by temperature sensor 60 is changed by about 50° C. before and after application of the voltage to electrostatic chuck 20. In other words, the amount of change in the substrate temperature before and after application of the voltage to electrostatic chuck 20 also serves as an index for evaluating the adsorptivity of electrostatic chuck 20. Therefore, by providing a threshold value in the amount of change in the substrate temperature and setting the standby temperature within the range of the substrate temperature in which the amount of change in the substrate temperature becomes greater than or equal to the threshold value, semiconductor substrate 70 can be securely adsorbed on electrostatic chuck 20.

First Embodiment

Figure 6:
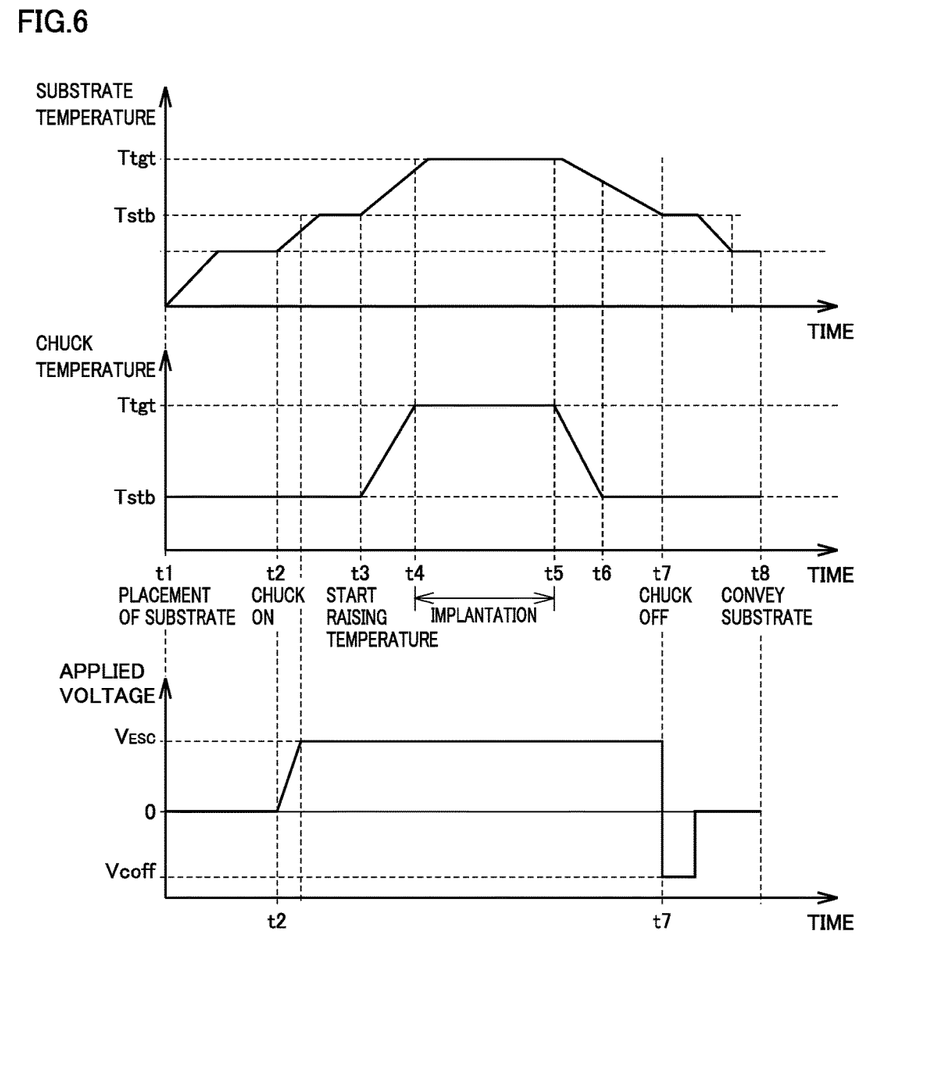
FIG. 6 illustrates a method for manufacturing a semiconductor device in accordance with a first embodiment.

Referring to FIG. 6, a first embodiment of a method for manufacturing a semiconductor device in accordance with the embodiment of the present invention will be described.

FIG. 6 represents time variation in an applied voltage to electrostatic chuck 20, a temperature of electrostatic chuck 20, and the substrate temperature in the process of implanting impurity ion to semiconductor substrate 70 (FIG. 2). The horizontal axis denotes time, and the vertical axis denotes a temperature or a voltage. The lower part of FIG. 6 represents time variation in the voltage applied to electrostatic chuck 20 from the step of placing semiconductor substrate 70 (S20) to the step of conveying semiconductor substrate 70 (S80). The middle part of FIG. 6 represents time variation in the temperature (chuck temperature) of electrostatic chuck 20 from the step of placing semiconductor substrate 70 (S20) to the step of conveying semiconductor substrate 70 (S80). The upper part of FIG. 6 represents time variation in the temperature (substrate temperature) of semiconductor substrate receiving heat from electrostatic chuck 20. This substrate temperature is measured by temperature sensor 60 (FIG. 1). It should be noted that Tstb represents the standby temperature, and Ttgt represents the target temperature of the step of implanting ion (S50).

At the time point (time t1) where semiconductor substrate 70 is place, electrostatic chuck 20 is heated by heater 25, and its temperature is raised to standby temperature Tstb. At this time point, no voltage is applied to the pair of electrostatic adsorption electrodes 21, 22 of electrostatic chuck 20 yet, and no electrostatic adsorption force is generated between electrostatic chuck 20 and semiconductor substrate 70.

After the time point (time t1) where semiconductor substrate 70 is placed, semiconductor substrate 70 receives heat transmission from electrostatic chuck 20, and the temperature of semiconductor substrate 70 is raised. However, since the substrate temperature does not exceed standby temperature Tstb, warpage of semiconductor substrate 70 is suppressed.

Next, in the state where the temperature of electrostatic chuck 20 is raised to standby temperature Tstb, a voltage is applied to the pair of electrostatic adsorption electrodes 21, 22 of electrostatic chuck 20 (time t2). At this time, as shown in FIG. 6, the applied voltage to electrostatic chuck 20 may be increased instantly at a constant rate to a predetermined target voltage $V_{ESC}$. Alternatively, as described below, the applied voltage may be set to a voltage lower than target voltage $V_{ESC}$.

Since the warpage of semiconductor substrate 70 is suppressed, the electrostatic adsorption force is generated between electrostatic chuck 20 and semiconductor substrate 70, so that semiconductor substrate 70 is adsorbed on electrostatic chuck 20. Semiconductor substrate 70 receives heat transmission from electrostatic chuck 20, and its temperature is further raised to reach the same temperature (standby temperature Tstb) as electrostatic chuck 20.

In the state where the substrate temperature has reached standby temperature Tstb, the step of raising the temperature of electrostatic chuck 20 (S40) is started (time t3). Temperature control unit 40 in electrostatic chuck 20 controls an electric current applied to heater 25 to raise the temperature of electrostatic chuck 20 to target temperature Ttgt (time t4). Following the rise in temperature of electrostatic chuck 20, the substrate temperature is also raised to target temperature Ttgt.

When the substrate temperature reaches target temperature Ttgt, the step of implanting ion to semiconductor substrate 70 (S50) is performed. During the step of implanting ion, the substrate temperature is maintained at target temperature Ttgt.

After the step of implanting ion is terminated (time t5), the step of lowering the temperature of electrostatic chuck 20 (S60) is started. Temperature control unit 40 reduces the amount of an electric current applied to heater 25 or stops the electric current applied to heater 25 to lower the temperature of electrostatic chuck 20 to standby temperature Tstb (time t6).

Following the lowering in the temperature of electrostatic chuck 20, the temperature of semiconductor substrate 70 is lowered. When the substrate temperature reaches standby temperature Tstb, the step of releasing chucking of semiconductor substrate 70 (S70) is performed (time t7). In this step, the electrostatic adsorption for ce is attenuated by reversing the polarities of voltages applied to the pair of electrostatic adsorption electrodes 21, 22 in electrostatic chuck 20. In the state where semiconductor substrate 70 is not adsorbed on electrostatic chuck 20, semiconductor substrate 70 is conveyed to outside of vacuum chamber 10 of ion implantation device 1 (time t8).

In the first embodiment, a time period from the time point (time t2) of starting application of voltage to electrostatic chuck 20 to the time point (time t3) of starting the rise in temperature of electrostatic chuck 20 is set to include a time required to unify the temperature in semiconductor substrate 70 plane to standby temperature Tstb. In other words, after awaiting the temperature of semiconductor substrate 70 to be uniformly raised to standby temperature Tstb, the second step of temperature raising operation is started. Accordingly, in the second step of the temperature raising operation, the temperature of semiconductor substrate 70 can be uniformly raised to target temperature Ttgt in a short period of time.

It should be noted that, although the first embodiment illustrates the configuration in which the voltages are applied to the pair of electrostatic adsorption electrodes 21, 22 of electrostatic chuck 20 in the state where electrostatic chuck 20 is maintained at standby temperature Tstb, it may be configured to apply a voltage to electrostatic chuck 20 while raising the temperature of electrostatic chuck 20. In this case, after the temperature of electrostatic chuck 20 is raised to standby temperature Tstb, the voltage is applied to electrostatic chuck 20.

Moreover, in the first embodiment, since chucking of semiconductor substrate 70 is released after lowering the temperature of electrostatic chuck 20 to standby temperature Tstb, the warpage of semiconductor substrate 70 after the releasing of chucking is suppressed, so that conveyance of semiconductor substrate 70 can be readily performed. Moreover, since next semiconductor substrate 70 can be placed on electrostatic chuck 20 continuously after conveying semiconductor substrate 70, a throughput of the process of implanting ion can be improved.

Second Embodiment

Figure 7:
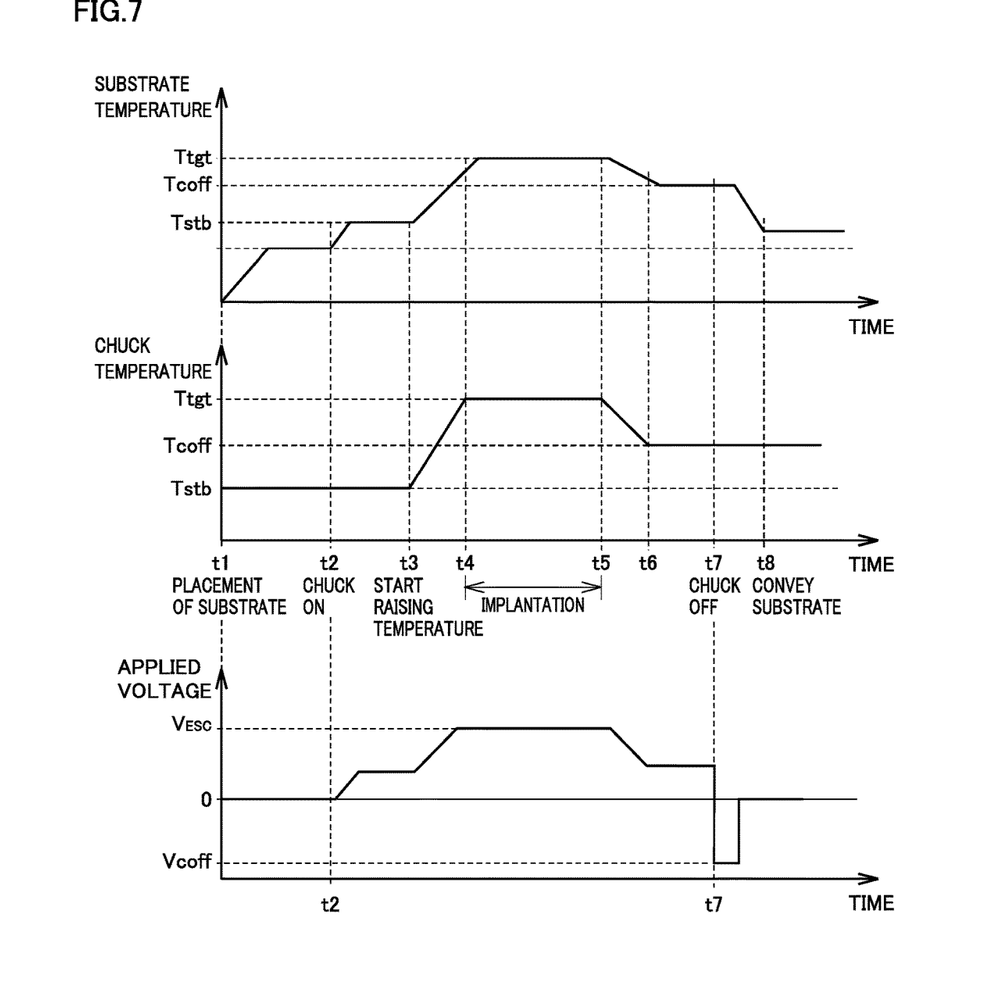
FIG. 7 illustrates a method for manufacturing a semiconductor device in accordance with a second embodiment.

Referring to FIG. 7, a second embodiment of a method for manufacturing a semiconductor device in accordance with the embodiment of the present invention will be described.

FIG. 7 represents time variation in an applied voltage to electrostatic chuck 20, a temperature of electrostatic chuck 20, and a substrate temperature in the step of implanting impurity ion to semiconductor substrate 70 (FIG. 2). The horizontal axis of FIG. 7 denotes time, and the vertical axis denotes a temperature or a voltage. As with FIG. 6, the lower part of FIG. 7 represents time variation in the voltage applied to electrostatic chuck 20 from the step of placing semiconductor substrate 70 (S20) to the step of conveying semiconductor substrate 70 (S80). The middle part of FIG. 7 represents time variation in a temperature (chuck temperature) from the step of placing semiconductor substrate 70 (S20) to the step of conveying semiconductor substrate 70 (S80). The upper part of FIG. 7 represents time variation in the temperature (substrate temperature) of semiconductor substrate 70 receiving heat from electrostatic chuck 20.

The method for manufacturing a semiconductor device in accordance with the second embodiment is different from the method for manufacturing a semiconductor device in accordance with the first embodiment shown in FIG. 6 in the step of chucking semiconductor substrate 70 (S30), the step of raising the temperature of electrostatic chuck 20 (S40), and the step of lowering the temperature of electrostatic chuck 20 (S60). Since other steps are the same as the first embodiment, detailed description thereof will not be repeated.

In the step of chucking semiconductor substrate 70 (S30), a voltage which is lower than target voltage $V_{ESC}$ is applied to the pair of electrostatic adsorption electrodes 21, 22 in electrostatic chuck 20. Then, in the step of raising the temperature of electrostatic chuck 20 (S40), the applied voltage to electrostatic chuck 20 is increased to target voltage $V_{ESC}$.

With such a configuration, the electrostatic adsorption force generated between electrostatic chuck 20 and semiconductor substrate 70 becomes greater as the substrate temperature is raised. A stress acts on an adhesion surface between semiconductor substrate 70 and electrostatic chuck 20 so as to suppress thermal expansion of semiconductor substrate 70. Since the stress can be relaxed by gradually increasing the electrostatic adsorption force, electrostatic chuck 20 can be prevented from being damaged.

It should be noted that it would not be necessary to allow the timing of increasing the applied voltage to electrostatic chuck 20 from the voltage in the step of chucking semiconductor substrate 70 (S30) to be matched with the timing of starting the step of raising the temperature of electrostatic chuck 20 (S40).

In the step of lowering the temperature of electrostatic chuck 20 (S60), temperature control unit 40 reduces the amount of an electric current applied to heater 25 or stops the electric current applied to heater 25 to lower the temperature of electrostatic chuck 20 to a predetermined chuck-off temperature Tcoff (time t6). After the temperature of semiconductor substrate 70 is lowered following the lowering of the temperature of electrostatic chuck 20, and the substrate temperature became chuck-off temperature Tcoff, the step of releasing chucking of semiconductor substrate 70 is performed (time t7).

Here, chuck-off temperature Tcoff is set to a temperature which is lower than or equal to target temperature Ttgt and higher than standby temperature Tstb. Thus, when the electrostatic adsorption force of electrostatic chuck 20 is reduced in the state where semiconductor substrate 70 is at chuck-off temperature Tcoff, the warpage occurs in semiconductor substrate 70. Accordingly, since the distance between electrostatic chuck 20 and semiconductor substrate 70 become larger, semiconductor substrate 70 can be readily peeled off from electrostatic chuck 20.

Modified Examples of First and Second Embodiments

In the following, referring to FIGS. 6 and 7, modified examples of the method for manufacturing a semiconductor device in accordance with the above-described first and second embodiments will be described.

(1) The time point of starting application of a voltage to electrostatic chuck 20 (time t2) may be during the rise in temperature of semiconductor substrate 70 after the time point of placing semiconductor substrate 70 (time t1). Alternatively, it may be the time when the substrate temperature is stable after awaiting a certain period of time from the time point of placing semiconductor substrate 70 (time t1).

In the former case, since the heat transfer from electrostatic chuck 20 to semiconductor substrate 70 is improved, the temperature of semiconductor substrate 70 can be raised in a short period of time. On the other hand, in the latter case, the temperature in the plane of semiconductor substrate 70 can be unified. Moreover, since the stress acting on the adhesion surface between semiconductor substrate 70 and electrostatic chuck 20 is reduced, the stage of electrostatic chuck 20 can be prevented from being damaged.

(2) The time point to start raising the temperature of electrostatic chuck 20 (time t3) may be before the substrate temperature reaches standby temperature Tstb. As compared to starting raising the temperature of electrostatic chuck 20 in the state where the substrate temperature has reached standby temperature Tstb, the temperature of semiconductor substrate 70 can be raised to target temperature Ttgt in a short period of time.

(3) As to the step of raising the temperature of electrostatic chuck 20 to target temperature Ttgt (from time t3 to time t4), the temperature of electrostatic chuck 20 may be raised in a stepwise manner. According to this, since semiconductor substrate 70 can be adsorbed on electrostatic chuck 20 while relaxing the thermal expansion of semiconductor substrate 70, the stage of electrostatic chuck 20 can be prevented from being damaged.

(4) As to the step of chucking semiconductor substrate 70, the timing at which the applied voltage to electrostatic chuck 20 reaches target voltage $V_{ESC}$ may be any timing as long as it is between the time point of starting application of a voltage to electrostatic chuck 20 (time t2) and the time point at which the temperature of electrostatic chuck 20 reaches target temperature Ttgt (time t4). Thus, the applied voltage to electrostatic chuck 20 may be increased in a stepwise manner to target voltage $V_{ESC}$ from time t2 to time t4. By gradually increasing the electrostatic adsorption force, the temperature of semiconductor substrate 70 can be raised while relaxing the thermal expansion of semiconductor substrate 70.

(5) The time point of releasing the chucking of semiconductor substrate 70 (time t7) may be between the time point of terminating the step of implanting ion (time t5) and the time point of lowering the temperature of electrostatic chuck 20 to standby temperature Tstb (time t6). For example, chucking of semiconductor 70 may be released at the time of terminating the step of implanting ion (time t5). Since the temperature of semiconductor substrate 70 can be lowered in a shorter period of time, a throughput of the process of ion implantation treatment is improved.

Alternatively, chucking of semiconductor substrate 70 may be released after waiting until the temperature of semiconductor substrate 70 is lowered to predetermined chuck-off temperature Tcoff. According to this, since the mechanism for conveying semiconductor substrate 70 to outside of the vacuum chamber can be constituted of a material having a low heat resistance, the cost of production equipment can be reduced.

(6) In the step of releasing chucking of semiconductor substrate 70, the applied voltage to electrostatic chuck 20 may be changed in a stepwise manner from target voltage $V_{ESC}$ to predetermined chuck-off voltage Vcoff. As shown in FIG. 6, if the applied voltage to electrostatic chuck 20 is switched instantly to chuck-ff voltage Vcoff, there is a possibility that the semiconductor substrate 70 may be warped and may spring up from the stage of electrostatic chuck 20. Such a phenomenon can be prevented by attenuating the electrostatic adsorption force.

It should be noted that, although the configuration of retaining the semiconductor substrate in the vacuum chamber by the electrostatic chuck adsorbing the semiconductor substrate is described in the embodiments of the present invention, the present invention can also be applied to a substrate holder configured to retain the semiconductor substrate with the electrostatic adsorption due to a supply of power from outside.

It should be understood that the embodiments disclosed herein are illustrative and non-restrictive in every respect.

The scope of the present invention is defined by the scope of the claims, rather than the description above, and is intended to include any modifications within the scope and meaning equivalent to the scope of the claims.

INDUSTRIAL APPLICABILITY

The present invention is applied particularly advantageously to a method for manufacturing a semiconductor device including the step of heat-treating a large diameter (particularly, an outer diameter is larger than 100 mm) semiconductor substrate to a high temperature.

REFERENCE SIGNS LIST 1 ion implantation device; 10 vacuum chamber; 20 electrostatic chuck; 21, 22 electrostatic adsorption electrode; 25 heater; 26, 60 temperature sensor; 30 direct current power supply; 40 temperature control unit; 50 source; 70 semiconductor substrate.

The invention claimed is:

1. A method for manufacturing a semiconductor device comprising the steps of:
   preparing a semiconductor substrate;
   raising a temperature of an electrostatic chuck to a first temperature;
   placing the semiconductor substrate on the electrostatic chuck while keeping the temperature of the electrostatic chuck at the first temperature;
   chucking the semiconductor substrate to the electrostatic chuck maintained at the first temperature;
   waiting for a temperature of the semiconductor substrate to be raised to the first temperature by a heat transfer from the electrostatic chuck to the semiconductor substrate;
   raising a temperature of the electrostatic chuck to a second temperature which is higher than the first temperature in a state where the semiconductor substrate is chucked; and
   performing a treatment to the semiconductor substrate in a state where a temperature of the electrostatic chuck is maintained at the second temperature.

2. The method for manufacturing a semiconductor device according to claim 1, wherein in the step of raising a temperature to the second temperature, raising a temperature of the electrostatic chuck is started after a temperature of the semiconductor substrate is raised to the first temperature.

3. The method for manufacturing a semiconductor device according to claim 1, wherein the electrostatic chuck includes an electrode configured to generate an electrostatic adsorption force with respect to the semiconductor substrate in accordance with an applied voltage, and in the step of chucking the semiconductor substrate, a first voltage is applied to the electrode, and in the step of raising a temperature to the second temperature, the applied voltage to the electrode is increased to a second voltage which is higher than the first voltage.

4. The method for manufacturing a semiconductor device according to claim 1, further comprising the step of: after the step of performing a treatment to the semiconductor substrate, releasing chucking of the semiconductor substrate after lowering a temperature of the electrostatic chuck to the first temperature.

5. The method for manufacturing a semiconductor device according to claim 1, further comprising the step of: after the step of performing a treatment to a semiconductor substrate, releasing chucking of the semiconductor substrate after lowering a temperature of the electrostatic chuck to a third temperature which is lower than or equal to the second temperature and higher than or equal to the first temperature.

6. The method for manufacturing a semiconductor device according to claim 1, wherein the first temperature is set to be within a temperature range in which a rate of change in an electrostatic capacity of the electrostatic chuck before and after the step of chucking the semiconductor substrate becomes less than or equal to a threshold value, the rate of change in the electrostatic capacity of the electrostatic chuck before and after the step of chucking the semiconductor substrate decreasing as the amount of warpage of the semiconductor substrate decreases, the threshold value corresponding to the upper limit value of the amount of warpage of the semiconductor substrate.

7. The method for manufacturing a semiconductor device according to claim 1, wherein the first temperature is set to be within a temperature range in which an amount of change in a temperature of the semiconductor substrate before and after the step of chucking the semiconductor substrate becomes greater than or equal to a threshold value, the amount of change in the temperature of the semiconductor substrate before and after the step of chucking the semiconductor substrate increasing as the amount of warpage of the semiconductor substrate decreases, the threshold value corresponding to the upper limit value of the amount of warpage of the semiconductor substrate.

8. The method for manufacturing a semiconductor device according to claim 1, wherein the step of performing a treatment to a semiconductor substrate includes the step of implanting impurity ion to the semiconductor substrate, and the second temperature is set to be within a temperature range of higher than or equal to 100° C. and lower than or equal to 800° C., and the first temperature is set to be within a temperature range of higher than or equal to a room temperature and lower than or equal to 700° C.

9. The method for manufacturing a semiconductor device according to claim 1, wherein the semiconductor substrate is a compound semiconductor substrate having an outer diameter which is larger than 100 mm and smaller than or equal to 150 mm.

10. The method for manufacturing a semiconductor device according to claim 9, wherein the semiconductor substrate is a silicon carbide semiconductor substrate having an outer diameter which is larger than 100 mm and smaller than or equal to 150 mm.

11. The method for manufacturing a semiconductor device according to claim 1, wherein a period of time of performing the step of waiting for the temperature of the semiconductor substrate to be raised to the first temperature is set to include a period required to uniformly raise the temperature the substrate to the first temperature.

12. The method for manufacturing a semiconductor device according to claim 1, wherein the first temperature is set to be within a range of a substrate temperature in which an amount of warpage of the semiconductor substrate is smaller than or equal to an upper limit value at which an electrostatic attraction force of the electrostatic chuck can attract the semiconductor substrate.

13. A method for manufacturing a semiconductor device comprising the steps of:
preparing a semiconductor substrate;
raising a temperature of an electrostatic chuck to a first temperature before placing the semiconductor substrate thereon;
placing the semiconductor substrate on the electrostatic chuck while keeping the temperature of the electrostatic chuck at the first temperature, after raising the temperature of the electrostatic chuck to the first temperature;
chucking the semiconductor substrate to the electrostatic chuck maintained at the first temperature;
waiting for a temperature of the semiconductor substrate to be raised to the first temperature by a heat transfer from the electrostatic chuck to the semiconductor substrate before performing a treatment to the semiconductor substrate;
raising a temperature of the electrostatic chuck to a second temperature which is higher than the first temperature in a state where the semiconductor substrate is chucked before performing the treatment to the semiconductor substrate; and
performing the treatment to the semiconductor substrate in a state where a temperature of the electrostatic chuck is maintained at the second temperature.

14. A method for manufacturing a semiconductor device comprising the steps of:
preparing a semiconductor substrate;
raising a temperature of an electrostatic chuck to a first temperature before placing the semiconductor substrate thereon;
placing the semiconductor substrate on the electrostatic chuck while keeping the temperature of the electrostatic chuck at the first temperature, after raising the temperature of the electrostatic chuck to the first temperature;
chucking the semiconductor substrate to the electrostatic chuck maintained at the first temperature;
waiting for a temperature of the semiconductor substrate to be raised to the first temperature by a heat transfer from the electrostatic chuck to the semiconductor substrate before implanting ions into the semiconductor substrate;
raising a temperature of the electrostatic chuck to a second temperature which is higher than the first temperature in a state where the semiconductor substrate is chucked before implanting the ions into the semiconductor substrate; and
implanting the ions into the semiconductor substrate in a state where a temperature of the electrostatic chuck is maintained at the second temperature.

* * * * *